United States Patent
Aono et al.

(10) Patent No.: US 10,438,861 B2
(45) Date of Patent: Oct. 8, 2019

(54) SEMICONDUCTOR DEVICE AND METHOD FOR MANUFACTURING THE SAME

(71) Applicant: Renesas Electronics Corporation, Tokyo (JP)

(72) Inventors: Hideki Aono, Tokyo (JP); Makoto Ogasawara, Tokyo (JP); Naohito Suzumura, Tokyo (JP); Tetsuya Yoshida, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/280,308

(22) Filed: Sep. 29, 2016

(65) Prior Publication Data
US 2017/0092555 A1 Mar. 30, 2017

(30) Foreign Application Priority Data
Sep. 30, 2015 (JP) .................... 2015-194127

(51) Int. Cl.
*H01L 21/66* (2006.01)
*G01R 31/26* (2014.01)
*H01L 29/78* (2006.01)

(52) U.S. Cl.
CPC .......... *H01L 22/34* (2013.01); *G01R 31/2621* (2013.01); *G01R 31/2628* (2013.01); *G01R 31/2642* (2013.01); *H01L 22/26* (2013.01); *H01L 22/14* (2013.01); *H01L 29/785* (2013.01)

(58) Field of Classification Search
CPC ......... H01L 27/11521; H01L 29/42328; H01L 21/28282
USPC .................................................. 257/E29.306
See application file for complete search history.

(56) References Cited

U.S. PATENT DOCUMENTS

| 6,198,301 B1 * | 3/2001 | Chetlur | G01R 31/275 |
| | | | 257/E21.531 |
| 6,420,758 B1 * | 7/2002 | Nakajima | H01L 29/4908 |
| | | | 257/350 |
| 2002/0008252 A1 * | 1/2002 | Koike | G01R 31/287 |
| | | | 257/200 |

(Continued)

FOREIGN PATENT DOCUMENTS

| JP | 2011-119724 A | 6/2011 |
| JP | 5498047 B2 | 5/2014 |

OTHER PUBLICATIONS

S.E. Liu et al., "Self-Heating Effect in FinFETs and Its Impact on Devices Reliability Characterization," IRPS 2014, IEEE, 4A.4.1-4A.4.4.

*Primary Examiner* — Jonathan Han
(74) *Attorney, Agent, or Firm* — Sughrue Mion, PLLC (57) ABSTRACT

To predict a temperature rise amount due to self-heating of a resistance value of a gate electrode with high accuracy in an HCI accelerated stress test. A gate electrode for gate resistance measurement (for temperature monitoring) that has contacts on its both sides, respectively, is disposed adjacent to the gate electrode. At the time of gate ON of the gate electrode, voltages that are substantially the same voltages as that of the gate electrode and have a minute potential difference between its contacts are applied between the contacts of the gate electrode for gate resistance measurement (for temperature monitoring), and a resistance value of the gate electrode for gate resistance measurement (for temperature monitoring) is measured.

10 Claims, 8 Drawing Sheets

(56) References Cited

U.S. PATENT DOCUMENTS

| | | | | |
|---|---|---|---|---|
| 2003/0195728 | A1* | 10/2003 | Koike | G06F 17/18 |
| | | | | 703/2 |
| 2007/0257299 | A1* | 11/2007 | Chen | H01L 27/115 |
| | | | | 257/315 |
| 2008/0116455 | A1* | 5/2008 | Jain | H03L 1/00 |
| | | | | 257/48 |
| 2010/0253416 | A1 | 10/2010 | Ishii | |
| 2011/0133292 | A1 | 6/2011 | Lee et al. | |
| 2012/0235156 | A1* | 9/2012 | Kuraguchi | H01L 29/42316 |
| | | | | 257/76 |
| 2015/0054053 | A1* | 2/2015 | Park | H01L 29/7881 |
| | | | | 257/316 |

* cited by examiner

A—A' (Fin section direction)    B—B' (Gate section direction)

FIG. 7H

A—A' (Fin section direction)    B—B' (Gate section direction)

FIG. 7I

A—A' (Fin section direction)    B—B' (Gate section direction)

FIG. 7J

A—A' (Fin section direction)    B—B' (Gate section direction)

FIG. 7K

A—A' (Fin section direction)    B—B' (Gate section direction)

FIG. 7L

A—A' (Fin section direction)    B—B' (Gate section direction)

SEMICONDUCTOR DEVICE AND METHOD FOR MANUFACTURING THE SAME

CLAIM OF PRIORITY

The present application claims priority from Japanese Patent application serial no. 2015-194127, filed on Sep. 30, 2015, the content of which is hereby incorporated by reference into this application.

BACKGROUND OF THE INVENTION

Filed of the Invention

The present invention relates to a semiconductor device and its manufacturing method, and in particular, to a technology that is effective when being applied to an HCI (hot carrier injection) accelerated stress test.

Description of the Related Art

With miniaturization of the MOS transistor, temperature rise at the time of product operation due to heating caused by a current that flows between the drain and the source at the time of gate ON has become a problem. In particular, since three-dimensional structure transistors such as a FinFET have a structure where heat generated by the current can hardly escape by diffusion, the above-mentioned temperature rise increases considerably.

This temperature rise also poses a problem that reliability of the FinFET is affected. In particular, HCI (Hot Carrier Injection) degradation that is degradation when a current flows between a drain and a source at the time of the gate ON is largely affected.

However, since an AC operation is performed at the time of real circuit operation, an actual temperature rise amount is mitigated as compared with that at the time of DC operation (DC stress), and becomes a temperature rise in the extent of 2° C. to 3° C. usually, which can be ignored. However, since the accelerated stress test at the time of estimating an HCI lifetime of the MOS transistor is carried out normally under DC stress, an influence of the temperature rise due to heating is large and degradation thereof is worst case at high temperature; therefore, the HCI lifetime is likely to be much overestimated.

Therefore, for exact lifetime prediction, it is necessary to measure the temperature rise due to heating at the time of the DC stress exactly and to perform correction on the temperature at the time of AC operation by correcting the temperature rise amount from temperature dependence of the HCI lifetime.

There is a technology like Patent Document 1 as a background art of this technical field. Patent Document 1 discloses a "semiconductor integrated circuit having a function of compensating a delay characteristic in the case of a situation where worst case at low temperature occurs.

Moreover, Patent Document 2 discloses a "FinFET having multiple fin heights and its formation method."

Moreover, Nonpatent Document 1 discloses a "technology of analyzing an influence of self-heating at the time of FinFET operation on HCI reliability."

Patent Document

[Patent Document 1] Japanese Patent No. 5498047
[Patent Document 2] Japanese Patent Application Laid-Open No. 2011-119724

Nonpatent Document

[Nonpatent Document 1] "Self-Heating effect in FinFETs and Its Impact on Devices Reliability Characterization," S. E. Liu, et al., 4A.4, IRPS 2014

As described above, in an HCI accelerated stress test, it is necessary to estimate an HCI lifetime in consideration of a difference in temperature being raised by self-heating at the times of DC stress and AC stress.

Although the above-mentioned Patent Document 1 is related with heating evaluation at the time of circuit operation, there is no description on either a problem like this at the time of the HCI accelerated stress test or its solution.

Moreover, although the above-mentioned Patent Document 2 is related with a formation process of a FinFET structure, it does not include a description about the HCI accelerated stress test.

Moreover, in the above-mentioned Nonpatent Document 1, a correlation between gate resistance value and power dissipation of a transistor is measured, a simulation that agrees with this measured result is found, and after this the temperature rise is predicted only by this simulation. Although dependence of Fin number etc. are measured and the simulation is brought into agreement with the measured result, it is not described whether a TEG (TEST ELEMENT GROUP) of the same structure as an actual reliability evaluation transistor is used. Moreover, in this patent, it is not clear how to measure the gate resistance value at the time of channel ON (in operation) and its simulation accuracy is also unknown.

Other problems and new features will become clear from description and the accompanying drawings of this specification.

SUMMARY OF THE INVENTION

According to the one embodiment, a gate electrode for gate resistance measurement (for temperature monitoring) that has respective contacts at both ends thereof is disposed adjacent to the gate electrode. At the time of gate ON of the gate electrode, by applying, between the contacts of the gate electrode for gate resistance measurement (for temperature monitoring), voltages that are substantially the same voltage as that of the gate electrode and have a minute potential difference between the contacts and by measuring a resistance value of the gate electrode for gate resistance measurement (for temperature monitoring), the temperature rise amount due to the self-heating of the resistance value of the gate electrode is predicted with high accuracy.

According to the one embodiment, it is possible to predict the temperature rise amount due to the self-heating of the resistance value of the gate electrode with high accuracy in the HCI accelerated stress test (at the time of the DC stress). This enables highly precise HCI lifetime prediction, which makes it possible to prevent degradation in yield due to guard band reinforcement etc. at the time of semiconductor product shipment resulting from excessive HCI degradation prediction.

Moreover, resistance measurement of the gate electrode in a standby state (at the time of the gate OFF and the drain ON) with high accuracy and verification of the temperature rise amount that could not be realized with conventional methods also becomes possible.

DETAILED DESCRIPTION OF THE PREFERRED EMBODIMENTS

Hereinafter, embodiments are described using drawings. Incidentally, in each drawing, the same sign is given to the same constitutional component, and a detailed explanation is omitted for an overlapping portion.

First Embodiment

Figure 8:
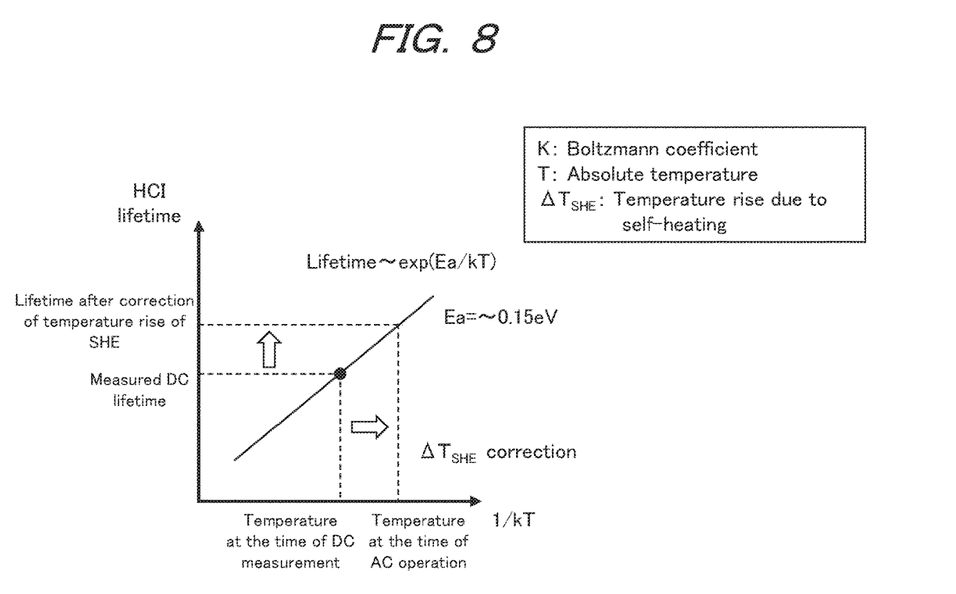
FIG. 8 is a diagram conceptually showing the HCI lifetime prediction method that corrects the temperature rise amount due to self-heating according to the one embodiment of the present invention.

First, correction of an HCI lifetime predictive value in an HCI accelerated stress test is explained using FIG. 8. A horizontal axis of a graph shown in FIG. 8 depicts a temperature of a gate electrode. Its unit is 1/kT and the temperature decreases toward the right-hand side of the graph from the left-hand side. A vertical axis of the graph depicts an HCI lifetime and the HCI lifetime becomes long toward the upper side from the lower side. Incidentally, in either of the horizontal axis and the vertical axis, a numerical value of the graph is shown as a relative value.

As described above, when a stress (voltage) is applied to the gate electrode, the temperature being raised by self-heating differs largely between at the time of DC stress and at the time of AC stress. As shown in FIG. 8, the temperature rise at the time of the DC stress is large compared with that at the time of the AC stress. Then, by performing correction of the temperature rise amount ($\Delta T_{SHE}$) due to the self-heating on the HCI lifetime (measured DC lifetime) that was computed based on the gate resistance value measured at the time of the DC stress, it is possible to predict the HCI lifetime after correction of the temperature rise caused by substrate hot electron (SHE) injection at the time of real circuit operation, i.e., at the time of the AC stress.

Figure 1:
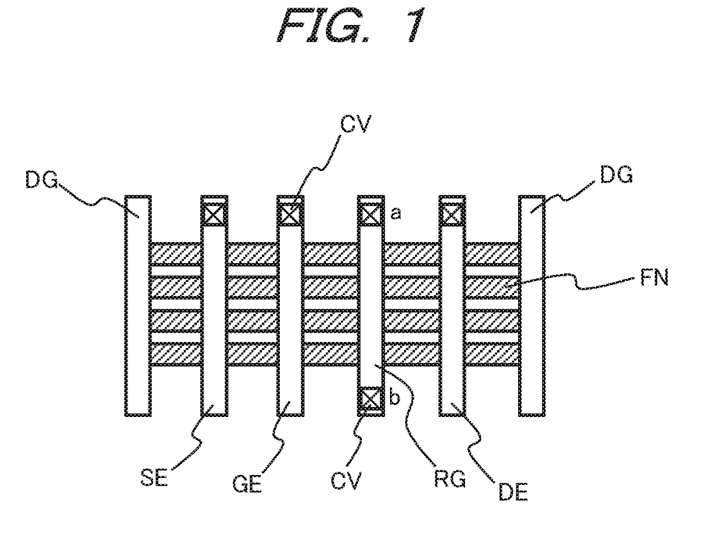
FIG. 1 is a plan view showing a TEG structure according to one embodiment of the present invention.
Figure 2:
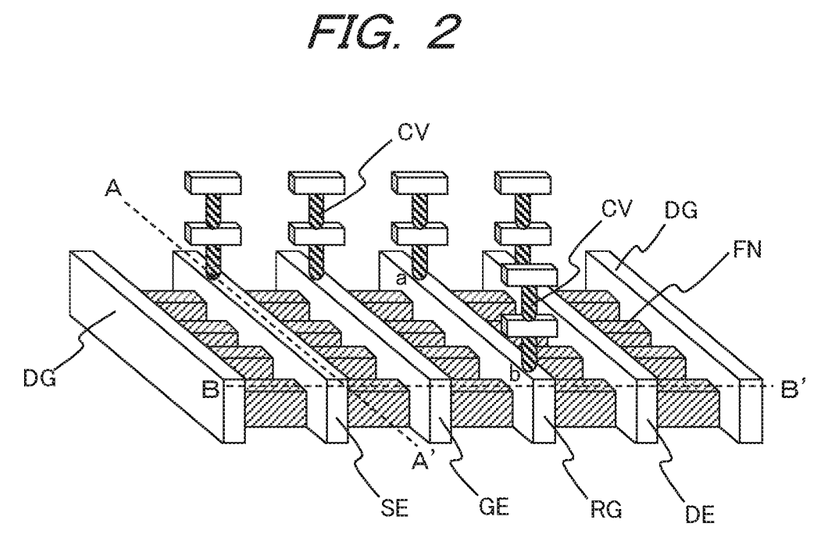
FIG. 2 is a perspective view of FIG. 1.

Next, a TEG structure for correcting the above-mentioned HCI lifetime predictive value is explained using FIG. 1 and FIG. 2. FIG. 1 is a plan view of the TEG structure of this embodiment, and FIG. 2 is a perspective view of FIG. 1. Incidentally, FIG. 1 and FIG. 2 show the example of the TEG that is provided in a part of a semiconductor device having a fin-type transistor (FinFET), or in a scribe area of a semiconductor wafer used in the manufacturing process of that semiconductor device.

The TEG structure of this embodiment is such that as shown in FIG. 1 and FIG. 2, a pair of a source electrode (region) SE and a drain electrode (region) DE is provided overlaying multiple protruding fin-type semiconductor regions (here, four fins FN). A gate electrode GE is provided between the source electrode SE and the drain electrode DE, and in addition, a gate electrode RG for gate resistance measurement (for temperature monitoring) is disposed between the gate electrode GE and the drain electrode DE, adjacent to the gate electrode GE.

Incidentally, the fin-type semiconductor region is formed protruding from the element isolation region on a semiconductor substrate being not illustrated. Moreover, the source electrode SE and the drain electrode DE in FIG. 1 and FIG. 2 are electrodes for supplying electric power to a source region and a drain region that were formed in the fin-type semiconductor region, respectively.

At one of two ends of each of the source electrode SE, the gate electrode GE, and the drain electrode DE, a contact (via) CV for applying a voltage to the each electrode (region) is provided. Moreover, the contacts (vias) CV are provided at both ends of the gate electrode RG for gate resistance measurement (for temperature monitoring), respectively. That is, one contact (via) CV is provided in each of the source electrode SE, the gate electrode GE, and the drain electrode DE, respectively, and two contacts (vias) CV are provided at the both ends of the gate electrode RG for gate resistance measurement (for temperature monitoring), respectively, one contact for one end.

Incidentally, in the TEG structure of FIG. 1 and FIG. 2, dummy gates DG are provided in the outside of the source electrode SE and the drain electrode DE, respectively. The dummy gate DG is provided with aims to secure processing uniformity of each electrode (region) in the dry etching process and to correct an optical proximity effect (OPC: Optical Proximity Correction) in the photolithography process when performing a formation process of a FinFET cell.

Using the TEG of a structure shown in FIG. 1 and FIG. 2, the resistance value of the gate electrode RG for gate resistance measurement (for temperature monitoring) is measured by applying voltages that are almost the same as an ON voltage of the gate electrode but differ between two contacts (vias) CV to the terminal a and the terminal b that are two contacts (vias) CV of the gate electrode RG for gate resistance measurement (for temperature monitoring) at the time of ON and OFF of the gate electrode. For example, a voltage higher than the gate ON voltage by +50 mV is applied to the terminal a, and the same voltage as that of the gate ON voltage is applied to the terminal b. From a difference in the resistance values at the times of gate ON and OFF, the temperature rise amount is evaluated and the HCI lifetime predictive value is corrected by a method to be described later.

Incidentally, it is desirable that a structure of the gate electrode RG for gate resistance measurement (for temperature monitoring) be such that it has as much the same structure as possible as that of the gate electrode GE that is an original gate electrode because a difference of the temperature rise due to the self-heating of the gate electrode GE is measured using its adjacent gate electrode RG for gate resistance measurement (for temperature monitoring).

Figure 3:
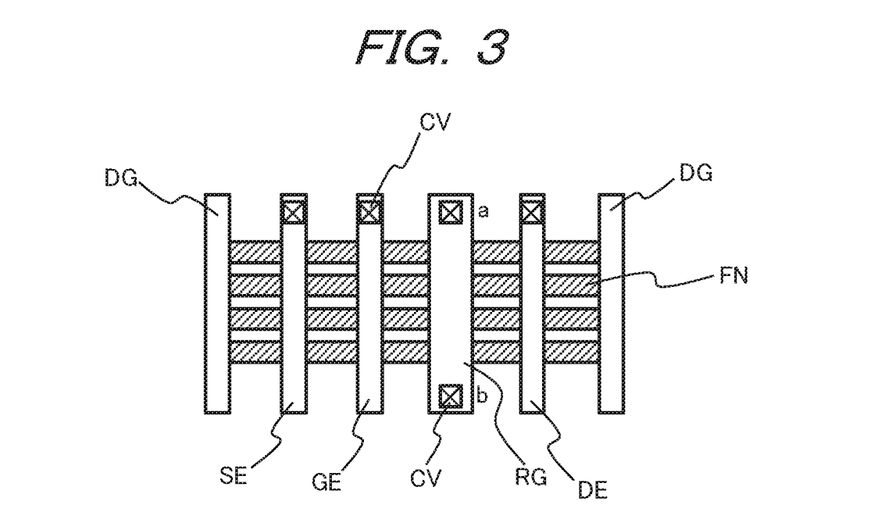
FIG. 3 is a plan view showing the TEG structure according to the one embodiment of the present invention.

FIG. 3 shows a modification of the TEG structure of FIG. 1 and FIG. 2. The TEG structure of FIG. 3 differs from the TEG structure of FIG. 1 and FIG. 2 in a respect that a gate length of the gate electrode RG for gate resistance measurement (for temperature monitoring) is formed to be wider (fatter) in width than a gate length of the gate electrode GE. By forming the gate length of the gate electrode RG for gate resistance measurement (for temperature monitoring) to be wider (fatter) in width than the gate length of the gate electrode GE, it is possible to reduce the resistance value of the gate electrode RG for gate resistance measurement (for temperature monitoring) and thereby to improve sensitivity at the time of measuring temperature dependence of the resistance value.

Figure 4:
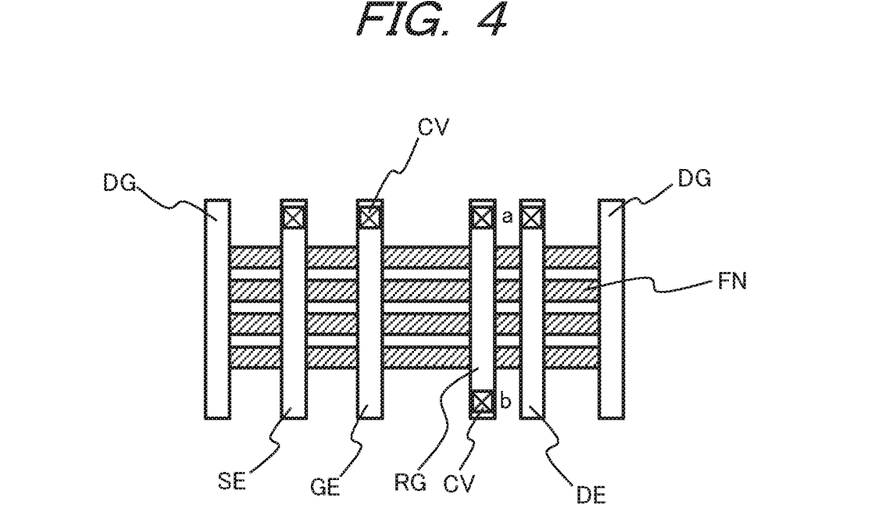
FIG. 4 is a plan view showing the TEG structure according to the one embodiment of the present invention.

FIG. 4 shows another modification of the TEG structure of FIG. 1 and FIG. 2. The TEG structure of FIG. 4 differs from the TEG structure of FIG. 1 and FIG. 2 in a respect that the gate electrode RG for gate resistance measurement (for temperature monitoring) is disposed to be closer to the drain electrode DE than in the TEG structure of FIG. 1 and FIG. 2. That is, the gate electrode RG for gate resistance measurement is disposed to be closer to the drain electrode DE side than to a middle of the source electrode SE and the drain electrode DE. By disposing the gate electrode RG for gate resistance measurement (for temperature monitoring) adjacent to the drain electrode DE, it becomes possible to measure also the temperature rise caused by the current when a stand-by leak current is large in a stand-by state of the real circuit (the voltage is applied only to the drain).

Figure 5:
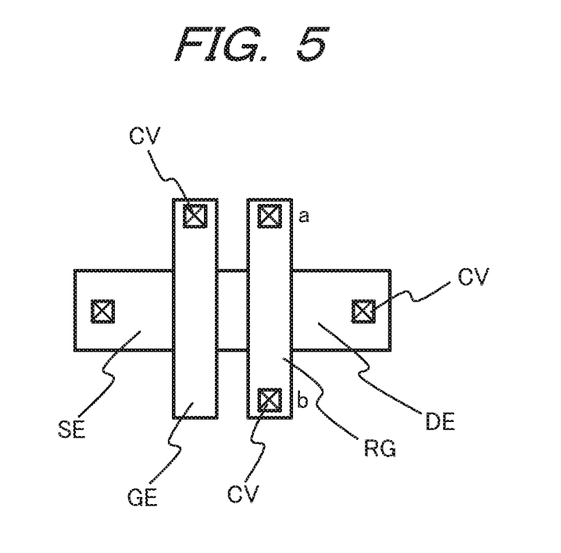
FIG. 5 is a plan view showing the TEG structure according to the one embodiment of the present invention.

FIG. 5 shows further another modification of the TEG structure of FIG. 1 and FIG. 2. Although the TEG structures of FIG. 1 to FIG. 4 are shown in the examples of the FinFET, the TEG structure of FIG. 5 is an example of a planar-type MOSFET. The TEG structure of FIG. 5 is such that the source electrode (region) SE and the drain electrode DE are formed overlaying a planar semiconductor region. In the source electrode (region) SE and the drain electrode DE, contacts (vias) CV for applying voltages to respective electrodes (regions) are provided. Moreover, the gate electrode GE is provided overlaying the source electrode (region) SE and the drain electrode DE, and in addition, the gate electrode RG for gate resistance measurement (for temperature monitoring) is disposed between the gate electrode GE and the drain electrode (region) DE, adjacent to the gate electrode GE.

The contact (via) CV for applying a voltage to the gate electrode GE is provided at one of two ends of the gate electrode GE. Moreover, the contacts (vias) CV are provided at both ends of the gate electrode RG for gate resistance measurement (for temperature monitoring). That is, the one contact (via) CV is provided in each of the source electrode (region) SE, the gate electrode GE, and the drain electrode (region) DE, and two contacts (vias) CV are provided at both ends of the gate electrode RG for gate resistance measurement (for temperature monitoring), respectively.

The TEG structure shown in FIG. 5 differs in form from the TEG structures shown in FIG. 1 to FIG. 4 because of a difference in the gate electrode (transistor) structure. Meanwhile, the TEG structure shown in FIG. 5 has a configuration common to those of the TEG structures shown in FIG. 1 to FIG. 4 in respects that the gate electrode GE and the gate electrode RG for gate resistance measurement (for temperature monitoring) are provided between a pair of the source electrode (region) SE and the drain electrode (region) DE and that the gate electrode RG for gate resistance measurement (for temperature monitoring) is disposed between the gate electrode GE and the drain electrode (region) DE.

Therefore, even in the case of the semiconductor device having the planar-type MOSFET, it is possible to correct the HCI lifetime predictive value like FinFET-type TEG structures shown in FIG. 1 to FIG. 4 by adopting the TEG structure as shown in FIG. 5. That is, it is possible to evaluate the temperature rise amount from a difference of the resistance values at the times of gate ON and OFF and thereby to correct the HCI lifetime predictive value by applying voltages that are almost the same as the ON voltage of the gate electrode but differ from each other to the terminal a and the terminal b that are two contacts (vias) CV of the gate electrode RG for gate resistance measurement (for temperature monitoring) and by measuring the resistance values of the gate electrode RG for gate resistance measurement (for temperature monitoring).

Figure 6:
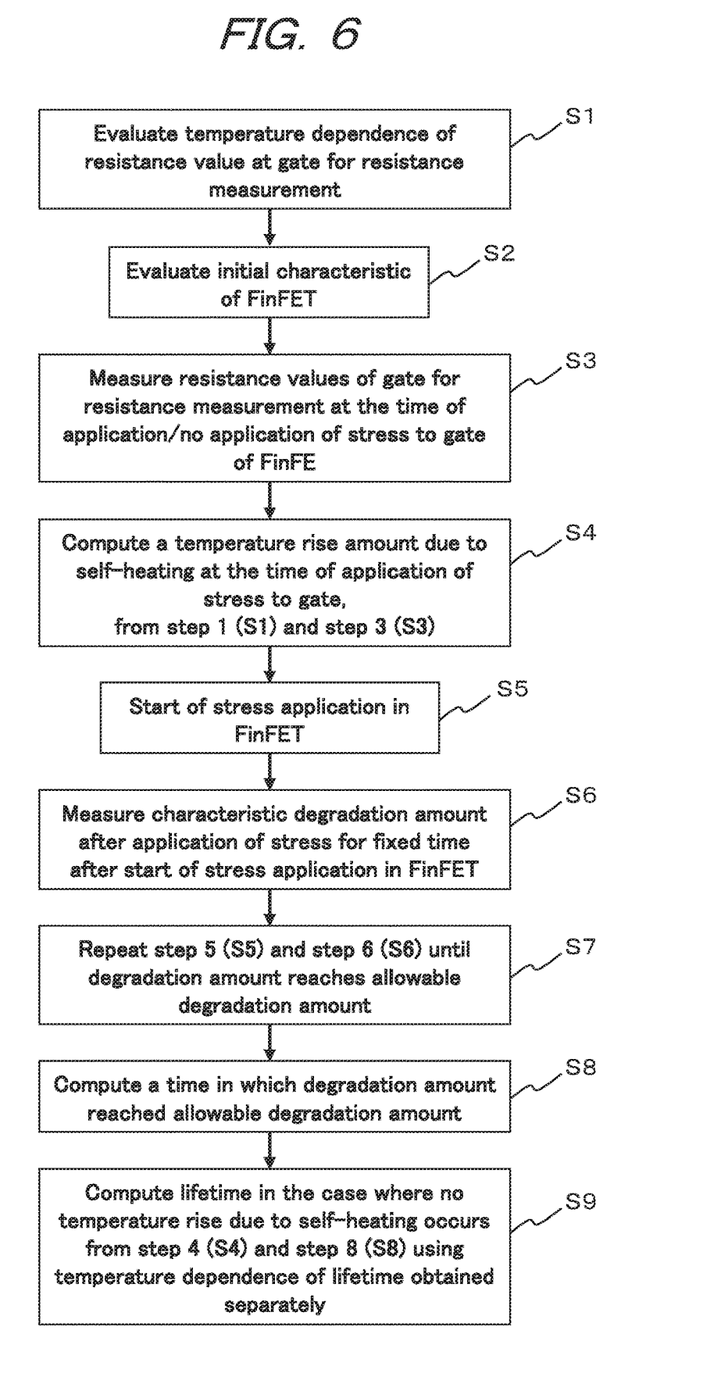
FIG. 6 is a flowchart showing an HCI lifetime prediction method according to the one embodiment of the present invention.

A method for performing HCI lifetime prediction by the TEG structures shown in FIG. 1 to FIG. 5 is explained using FIG. 6.

First, temperature dependence evaluation of the resistance value is carried out in the gate electrode RG for gate resistance measurement (for temperature monitoring). (Step S1)

Next, initial characteristic evaluation of the gate electrode GE (FinFET in FIG. 1 to FIG. 4; and MOSFET in FIG. 5) is carried out. (Step S2)

Subsequently, the resistance values of the gate electrode RG for gate resistance measurement (for temperature monitoring) at the times of application/no application of the stress to the gate electrode GE (FinFET in FIG. 1 to FIG. 4; and MOSFET in FIG. 5) is measured. (Step S3)

Subsequently, the temperature rise amount due to the self-heating at the time of application of the stress to the gate is computed from Step 1 (S1) to Step 3 (S3). (Step S4)

Subsequently, stress application in the gate electrode GE (FinFET in FIG. 1 to FIG. 4; and MOSFET in FIG. 5) is started. (Step S5)

Subsequently, a characteristic degradation amount of the gate electrode GE is measured after a fixed time lapses in a state where a stress (voltage) is being applied to the gate electrode GE at Step 5. (Step S6)

The stress application at step 5 and the measurement of the characteristic degradation amount at Step 6 are repeated until it reaches the allowable degradation amount. (Step S7)

Subsequently, a time in which the characteristic degradation amount reached the allowable degradation amount is computed as the HCI lifetime. (Step 8)

Finally, the HCI lifetime when there is no temperature rise due to the self-heating is computed from Step 4 and Step 8 using temperature dependence of the HCI lifetime obtained beforehand.

As explained above, according to the TEG structure and the HCI lifetime prediction method of this embodiment, it is possible to predict the temperature rise amount due to the self-heating of the resistance value of the gate electrode with high accuracy in the HCI accelerated stress test (at the time of the DC stress). This enables highly precise HCI lifetime prediction, which makes it possible to prevent reduction in yield due to guard band reinforcement etc. at the time of semiconductor product shipment resulting from excessive HCI degradation prediction.

Incidentally, although in this embodiment, the explanation was given using the example where the gate electrode RG for gate resistance measurement (for temperature monitoring) was disposed between the gate electrode GE and the drain electrode DE, it may be disposed between the gate electrode GE and the source electrode SE.

Second Embodiment

Figure 7A:
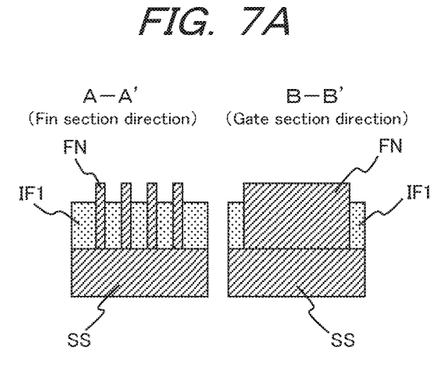
FIG. 7A is a sectional view showing a part of a manufacturing process of the TEG structure according to the one embodiment of the present invention.
Figure 7B:
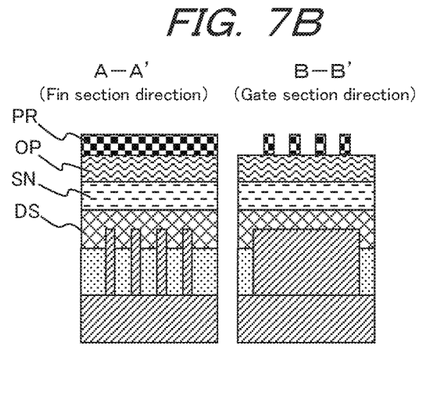
FIG. 7B is a sectional view showing a part of the manufacturing process of the TEG structure according to the one embodiment of the present invention.
Figure 7C:
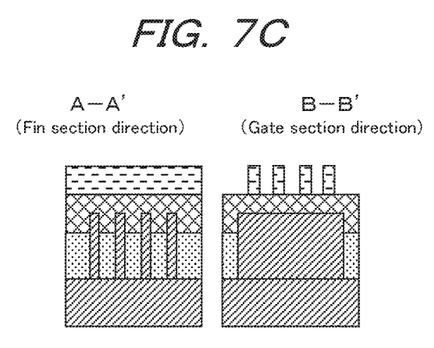
FIG. 7C is a sectional view showing a part of the manufacturing process of the TEG structure according to the one embodiment of the present invention.
Figure 7D:
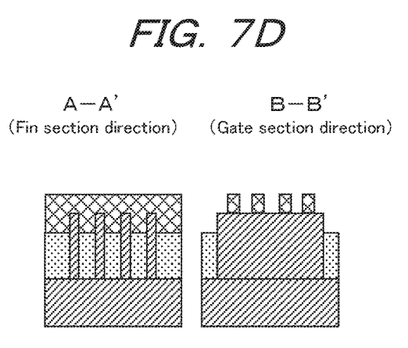
FIG. 7D is a sectional view showing a part of the manufacturing process of the TEG structure according to the one embodiment of the present invention.
Figure 7E:
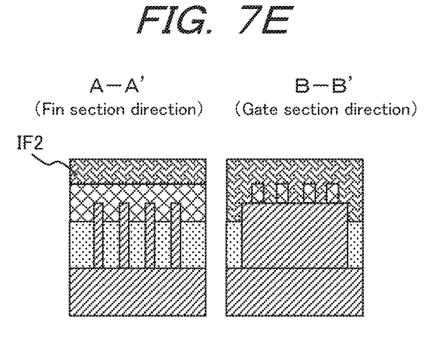
FIG. 7E is a sectional view showing a part of the manufacturing process of the TEG structure according to the one embodiment of the present invention.
Figure 7F:
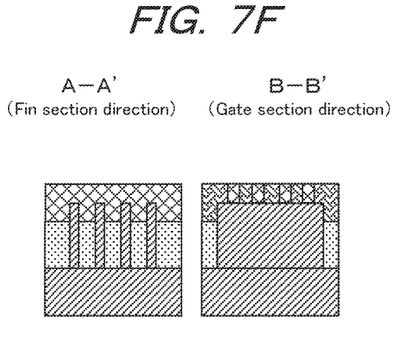
FIG. 7F is a sectional view showing a part of the manufacturing process of the TEG structure according to the one embodiment of the present invention.
Figure 7G:
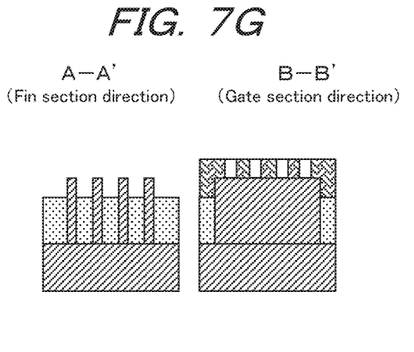
FIG. 7G is a sectional view showing a part of the manufacturing process of the TEG structure according to the one embodiment of the present invention.
Figure 7H:
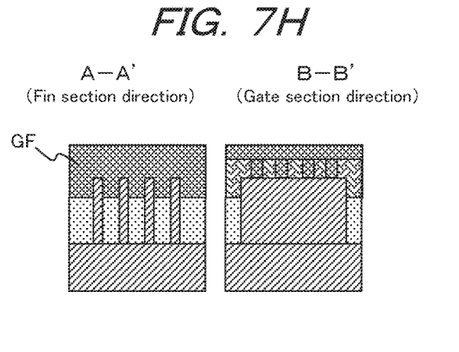
FIG. 7H is a sectional view showing a part of the manufacturing process of the TEG structure according to the one embodiment of the present invention.
Figure 7I:
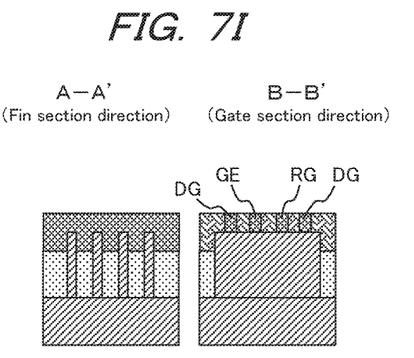
FIG. 7I is a sectional view showing a part of the manufacturing process of the TEG structure according to the one embodiment of the present invention.
Figure 7J:
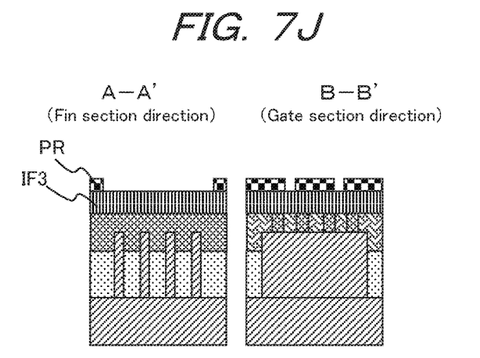
FIG. 7J is a sectional view showing a part of the manufacturing process of the TEG structure according to the one embodiment of the present invention.
Figure 7K:
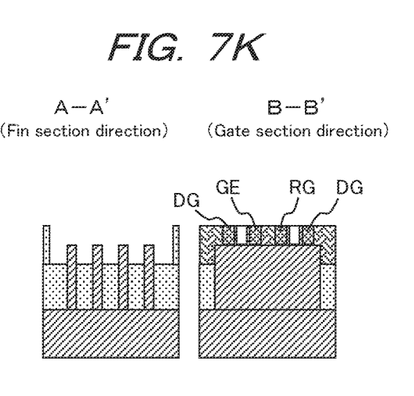
FIG. 7K is a sectional view showing a part of the manufacturing process of the TEG structure according to the one embodiment of the present invention.
Figure 7L:
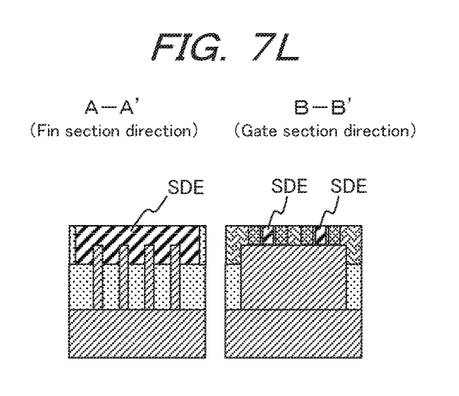
FIG. 7L is a sectional view showing a part of the manufacturing process of the TEG structure according to the one embodiment of the present invention.
Figure 7M:
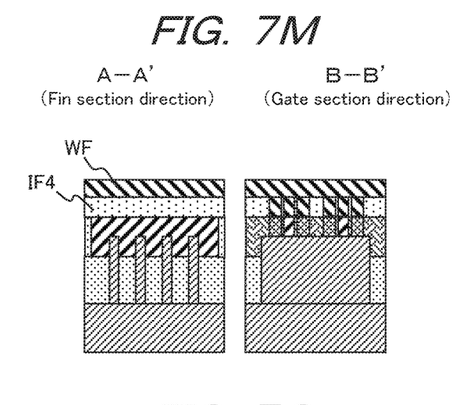
FIG. 7M is a sectional view showing a part of the manufacturing process of the TEG structure according to the one embodiment of the present invention.
Figure 7N:
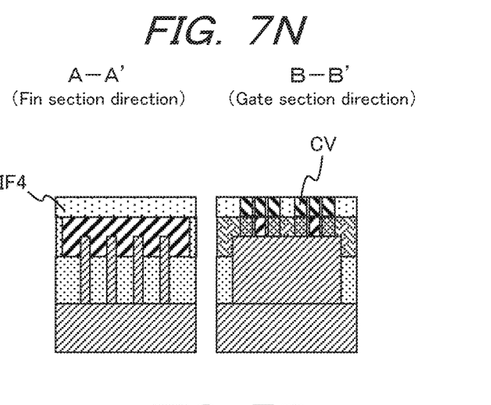
FIG. 7N is a sectional view showing a part of the manufacturing process of the TEG structure according to the one embodiment of the present invention.
Figure 7O:
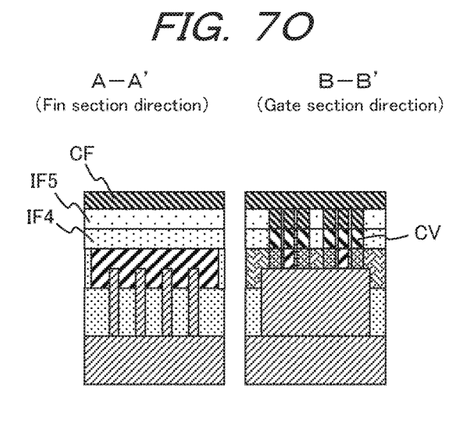
FIG. 7O is a sectional view showing a part of the manufacturing process of the TEG structure according to the one embodiment of the present invention.
Figure 7P:
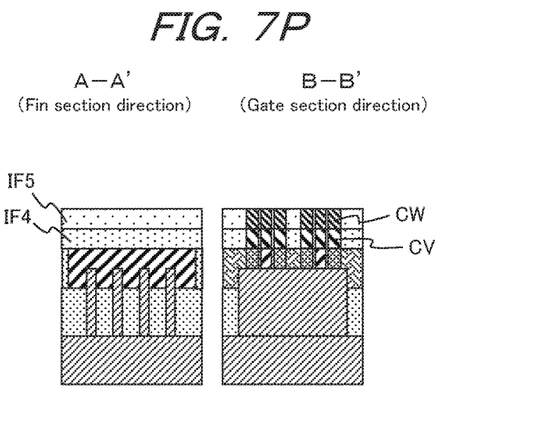
FIG. 7P is a sectional view showing a part of the manufacturing process of the TEG structure according to the one embodiment of the present invention.
Figure 7Q:
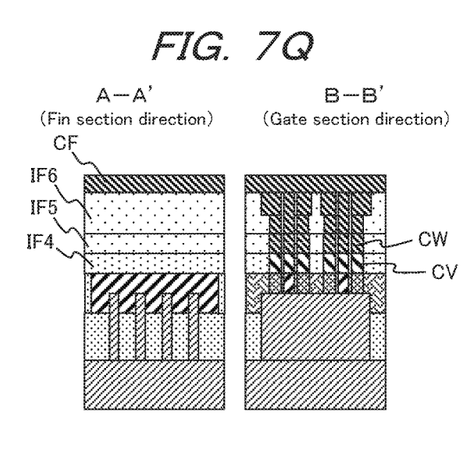
FIG. 7Q is a sectional view showing a part of the manufacturing process of the TEG structure according to the one embodiment of the present invention.
Figure 7R:
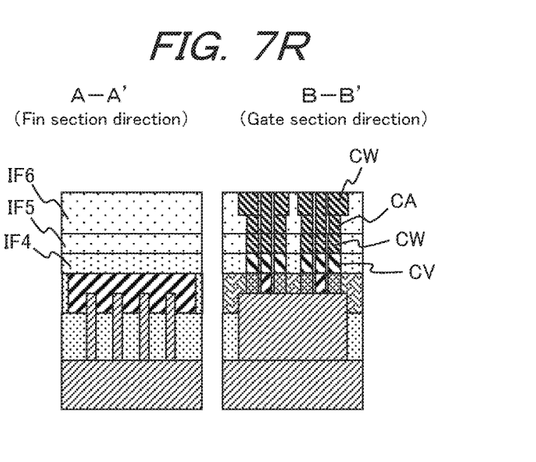
FIG. 7R is a sectional view showing a part of the manufacturing process of the TEG structure according to the one embodiment of the present invention.

The manufacturing process of the TEG structure shown in FIG. 1 and FIG. 2 is explained in order using FIG. 7A to FIG. 7R. Incidentally, in each drawing of FIG. 7A to FIG. 7R, a left-hand side drawing shows a state seeing from an A-A' section direction (Fin section direction) of FIG. 2, and a right-hand side drawing shows a state seeing from a B-B' section direction (gate section direction) of FIG. 2.

First, as shown in FIG. 7A, a fin FN that is a fin (Fin)-like semiconductor region is formed on a silicon substrate SS by a known art. Subsequently, desired impurities, such as boron (B), phosphor (P), and arsenic (As), are injected into the fin (Fin)-like semiconductor region by oblique ion implantation. The regions into which the impurities were injected become source/drain regions of a transistor. Here, a height of the fin FN is about 20 nm to 100 nm, for example. Moreover, a width (thickness) of the fin FN is about 10 nm to 50 nm, for example. Incidentally, since the height of both side surfaces of the fin FN and a width (thickness) of its upper surface become a channel width of a fin (Fin) type transistor, the channel width becomes about 50 nm to 250 nm. Subsequently, an insulation film IF1 is formed so as to embed spacing between fins FN to a fixed height.

Next, as shown in FIG. 7B, a dummy polysilicon film DS, a silicon nitride (SiN) film SN, and an organic planarizing layer (OPL) OP are formed sequentially from a lower layer with desired film thicknesses. Subsequently, a photoresist film PR is applied onto the organic planarizing layer (OPL) OP, and a four-gate electrode pattern is formed by lithography. Among these four gate electrodes, two at both ends are the dummy gates DG; among two gate electrodes between the dummy gates DG, one gate electrode GE is the gate electrode GE and the other electrode is the gate electrode RG for gate resistance measurement (for temperature monitoring).

Next, as shown in FIG. 7C, the organic planarizing layer (OPL) OP and the silicon nitride (SiN) film SN are dry etched using the photoresist film PR as a mask, and portions of the photoresist film PR and the organic planarizing layer (OPL) OP that remain without being etched are removed by $O_2$ (oxygen) asking etc. after the dry etching processing to form a hard mask made of the silicon nitride (SiN) film SN.

Next, as shown in FIG. 7D, the dummy polysilicon film DS is dry etched using the hard mask made of the silicon nitride (SiN) film SN to form the four-gate electrode pattern made of the dummy polysilicon film DS. After the dry etching processing, the silicon nitride (SiN) film SN serving as the hard mask is removed by wet etching etc.

Next, as shown in FIG. 7E, an insulation film IF2 is formed so as to cover the four-gate electrode pattern.

Next, as shown in FIG. 7F, the insulation film IF2 is ground until the four-gate electrode pattern is exposed by CMP polishing (Chemical Mechanical Polishing) and is flattened.

Next, as shown in FIG. 7G, the dummy polysilicon film DS is removed by wet etching etc.

Next, as shown in FIG. 7H, a gate electrode lamination film GF is formed so as to embed the opening after the dummy polysilicon film DS is removed. This gate electrode lamination film GF is a layered film that is configured with a gate insulation film consisting of a silicon oxide film ($SiO_2$ film) and a high-dielectric-constant film (High-k film), a metal film for $V_{th}$ adjustment, a W metal gate electrode film (tungsten film), etc. sequentially from a lower layer, for example. A film thickness of the silicon oxide film ($SiO_2$ film) is about 0.5 nm to 2.0 nm, for example. A film thickness of the high-dielectric-constant film (High-k film) is about 0.5 nm to 2.0 nm, for example. A film thickness of the metal film for $V_{th}$ adjustment is about 5 nm to 15 nm, for example. A film thickness of the W metal gate electrode film (tungsten film) is about 30 nm to 100 nm, for example.

Next, as shown in FIG. 7I, an excessive portion of the gate electrode lamination film GF is ground and removed by the CMP polishing to form the gate electrode GE and the gate electrode RG for gate resistance measurement (for temperature monitoring) that are sandwiched between two dummy gates DG.

Next, as shown in FIG. 7J, an insulation film IF3 is formed, subsequently the photoresist film PR is applied onto the insulation film IF3, and a pattern serving as extraction electrodes of the source/drain electrodes is formed by lithography.

Next, as shown in FIG. 7K, the insulation film IF3 is dry etched using the photoresist film PR as a mask, and openings for forming the extraction electrodes of the source/drain electrodes are formed between the dummy gate DG and the gate electrodes GE and between the gate electrode RG for gate resistance measurement (for temperature monitoring) and the dummy gate DG.

Next, as shown in FIG. 7L, by forming a metal film for the source/drain electrodes made of, for example, a tungsten (W) film etc. so that the opening formed in FIG. 7K may be embedded and by grinding and removing an excessive portion of the metal film for the source/drain electrodes by the CMP polishing, the source/drain extraction electrodes SDE are formed.

Next, as shown in FIG. 7M, an insulation film IF4 is formed, subsequently contact holes (openings) are formed on the gate electrode and the source/drain extraction electrodes, and, for example, a tungsten (W) film WF is formed by a CVD (Chemical Vapor Deposition) method etc. so as to embed the contact holes. A film thickness of the tungsten (W) film WF is about 50 nm to 100 nm, for example.

Next, as shown in FIG. 7N, an excessive portion of the tungsten (W) film WF is ground and removed by the CMP polishing to form the contacts (vias) CV. Incidentally, the excessive portion of the tungsten (W) film WF may be etched and removed by performing an etching back process based on the dry etching processing in place of the CMP polishing.

Next, as shown in FIG. 7O, an insulation film IF5 serving as an inter-layer insulation film is formed, subsequently a wiring groove (trench) is formed on the contact (via) CV, and a copper (Cu) film CF is formed so as to embed the groove (trench). A film thickness of the copper (Cu) film CF is about 50 nm to 100 nm, for example.

Next, as shown in FIG. 7P, an excessive portion of the copper (Cu) film CF is ground and removed by the CMP polishing to form copper (Cu) wiring CW. The process shown in FIG. 7O and FIG. 7P is a copper (Cu) wiring formation process by what is called a single damascene method.

Next, as shown in FIG. 7Q, an insulation film IF6 serving as an inter-layer insulation film is formed, subsequently an opening for a copper (Cu) via and a wiring groove (trench) are formed on the copper (Cu) wiring CW, and the copper (Cu) film CF is formed by a plating method so as to embed the opening for the copper (Cu) via and the wiring groove (trench). A film thickness of the copper (Cu) film CF is about 50 nm to 100 nm, for example.

Finally, as shown in FIG. 7R, an excessive portion of the copper (Cu) film CF is ground and removed by the CMP polishing to form the copper (Cu) via CA and the copper (Cu) wiring CW. The process shown in FIG. 7Q and FIG. 7R is a process for forming the copper (Cu) via and the copper (Cu) wiring by what is called a dual damascene method.

As explained above, the TEG structure shown in FIG. 1 and FIG. 2 is formed through the processes of FIG. 7A to FIG. 7R.

By virtue of the TEG structure formed by the manufacturing process explained in this embodiment, it is possible to predict the temperature rise amount due to the self-heating of the resistance value of the gate electrode with high accuracy in the HCI accelerated stress test (at the time of the DC stress). This enables the highly precise HCI lifetime prediction, which makes it possible to prevent the reduction in yield due to the guard band reinforcement etc. at the time of the semiconductor product shipment resulting from the excessive HCI degradation prediction.

Incidentally, in the HCI accelerated stress test using the TEG structure explained in each of the above-mentioned embodiments, what is necessary is just to have common evaluation equipment by which characteristics of the gate electrode of the FinFET transistor etc. are evaluated, and it is not necessary to create a circuit for resistance monitoring separately on the wafer; therefore, a chip area does not increase.

In the above, although the invention made by the present inventors was concretely explained based on the embodiments, it goes without saying that the present invention is not limited to the embodiments and can be altered variously without deviating from the gist thereof.

LIST OF REFERENCE SIGNS

GE—Gate electrode,
DG—Dummy gate,
SE—Source electrode,
DE—Drain electrode,
RG—Gate for resistance measurement,
CV—Contact (via),
FN—Fin,
SS—Silicon substrate,
IF, IF1, IF2, IF3, IF4, IF5, and IF6—Insulation film,
DS—Dummy polysilicon film,
SN—Silicon nitride (SiN) film,
OP—Organic planarizing layer (OPL),
PR—Photoresist film,
GF—Gate electrode lamination film,
SDE—Source/drain extraction electrodes (W),
WF—Tungsten (W) film,
CF—Copper (Cu) film,
CW—Copper (Cu) wiring,
CA—Copper (Cu) via.

What is claimed is:
1. A semiconductor device comprising:
a source region and a drain region disposed in a semiconductor substrate;
a first gate electrode disposed between the source region and the drain region;
a first electrode configured to supply electric power to the source region and a second electrode configured to supply electric power to the drain region; and
a second gate electrode configured to measure resistance and is disposed between the first electrode and the first gate electrode or between the second electrode and the first gate electrode and is disposed with a conductive film of the same layer as the first gate electrode,
wherein the semiconductor device is configured to perform a computation of a hot carrier lifetime of the first gate electrode, the computation comprising:
(S1) measuring temperature dependence of a resistance value of the second gate electrode for resistance measurement using the second gate electrode for resistance measurement;
(S2) measuring an initial characteristic of the first gate electrode;
(S3) measuring resistance values of the second gate electrode for resistance measurement at the time of application of a voltage to the first gate electrode and at the time of no application of the voltage to the first gate electrode;
(S4) computing a rise amount of the resistance value due to self-heating at the time of application of the voltage to the first gate electrode from temperature dependence of the resistance value of the second gate electrode for resistance measurement measured in the step (S1) and the resistance value of the second gate electrode for resistance measurement measured in the step (S3);
(S5) applying a predetermined voltage to the first gate electrode;
(S6) measuring a characteristic degradation amount of the first gate electrode after applying the predetermined voltage to the first gate electrode for a fixed time in the step (S5);

(S7) repeating the steps (S5) and (S6) until the characteristic degradation amount measured in the step (S6) reaches a predetermined value;

(S8) computing a hot carrier lifetime when the self-heating of the first gate electrode occurs from a time in which the characteristic degradation amount reached the predetermined value in the step (S7); and (S9) computing the hot carrier lifetime when no self-heating of the first gate electrode occurs using the temperature dependence of the hot carrier lifetime computed beforehand, the rise amount of the resistance value due to the self-heating at the time of application of the voltage to the first gate electrode computed in the step (S4), and the hot carrier lifetime when the self-heating of the first gate electrode computed in the step (S8) occurs, and wherein the first gate electrode comprises a first via at a first end, wherein the second gate electrode comprises a second via at a third end and a third via at a fourth end, and wherein the first gate electrode and the second gate electrode have a same thickness in a direction, perpendicular to each of the longitudinal axis of the first gate electrode and the longitudinal axis of the second gat electrode, from the source region to the drain region.

2. The semiconductor device according to claim 1, wherein contacts are disposed at both the third end and the fourth end of the second gate electrode for resistance measurement, respectively.

3. The semiconductor device according to claim 2, wherein voltages applied to the contacts of the second gate electrode are substantially the same as an ON voltage of the first gate electrode.

4. The semiconductor device according to claim 2, wherein voltages applied to the contacts of the second gate electrode differ at the time of ON and OFF of the first gate electrode.

5. The semiconductor device according to claim 1, wherein the source region and the drain region are disposed each protruding from an element isolation region disposed the semiconductor substrate, the first electrode and the second electrode are disposed with the conductive film of the same layer as the first gate electrode and the second gate electrode for resistance measurement, and the first electrode, the second electrode, the first gate electrode, and the second gate electrode for resistance measurement are disposed overlaying the protruding source region and drain region.

6. The semiconductor device according to claim 1, wherein a width of the second gate electrode for resistance measurement is wider than a width of the first gate electrode.

7. The semiconductor device according to claim 1, wherein the second gate electrode for resistance measurement is disposed between the second electrode and the first gate electrode.

8. The semiconductor device according to claim 1, wherein the first gate electrode comprises the first end and a second end, opposite the first end on a longitudinal axis of the first gate electrode, wherein the second gate electrode comprises the third end and the fourth end, opposite the third end on a longitudinal axis of the second gate electrode, and wherein a first length, from the first end to the second end, is the same as a second length, from the third end to the fourth end.

9. The semiconductor device according to claim 1, wherein the semiconductor substrate has a fin-like semiconductor region including the source region and the drain region, wherein the first gate electrode covers a region between the source region and the drain region in the fin-like region, and wherein the second gate electrode covers a region between the source region and the drain region in the fin-like region.

10. The semiconductor device according to claim 1, wherein the first electrode comprises a contact for applying an ON voltage to the first gate electrode.

* * * * *